(12) United States Patent
Bose

(10) Patent No.: US 8,479,082 B2
(45) Date of Patent: Jul. 2, 2013

(54) PACKET ERROR CORRECTION IN NETWORKS

(75) Inventor: Ranjan Bose, New Delhi (IN)

(73) Assignee: Indian Institute of Technology Delhi, New Delhi (IN)

(*) Notice: Subject to any disclaimer, the term of this patent is extended or adjusted under 35 U.S.C. 154(b) by 395 days.

(21) Appl. No.: 12/824,880

(22) Filed: Jun. 28, 2010

(65) Prior Publication Data
US 2011/0252292 A1 Oct. 13, 2011

(30) Foreign Application Priority Data
Apr. 7, 2010 (IN) .............................. 858/DEL/2010

(51) Int. Cl.
*H03M 13/00* (2006.01)
(52) U.S. Cl.
USPC ............ 714/776; 714/784; 714/780; 714/752
(58) Field of Classification Search
USPC .................... 714/776, 784, 780, 752
See application file for complete search history.

(56) References Cited

U.S. PATENT DOCUMENTS

| | | | | | |
|---|---|---|---|---|---|
| 5,140,596 | A | * | 8/1992 | Weldon, Jr. | 714/762 |
| 5,778,009 | A | * | 7/1998 | Fredrickson et al. | 714/752 |
| 6,012,159 | A | * | 1/2000 | Fischer et al. | 714/755 |
| 6,279,137 | B1 | * | 8/2001 | Poeppelman et al. | 714/781 |
| 6,360,348 | B1 | * | 3/2002 | Yang | 714/784 |
| 7,076,724 | B2 | * | 7/2006 | Cole et al. | 714/784 |
| 7,174,498 | B2 | | 2/2007 | Weissinger | |
| 7,191,376 | B2 | * | 3/2007 | Yedidia | 714/751 |
| 7,412,641 | B2 | * | 8/2008 | Shokrollahi | 714/776 |
| 7,516,393 | B2 | | 4/2009 | Hepner et al. | |
| 7,545,293 | B2 | * | 6/2009 | Reznik | 341/67 |
| 8,006,160 | B2 | * | 8/2011 | Chen et al. | 714/752 |
| 8,205,134 | B2 | * | 6/2012 | Harrison et al. | 714/758 |
| 2002/0191643 | A1 | * | 12/2002 | Yun et al. | 370/474 |
| 2006/0245384 | A1 | * | 11/2006 | Talukdar et al. | 370/310 |
| 2009/0313528 | A1 | * | 12/2009 | Chugg et al. | 714/758 |
| 2010/0257434 | A1 | * | 10/2010 | Harrison et al. | 714/785 |
| 2011/0029845 | A1 | * | 2/2011 | Zhou et al. | 714/776 |
| 2012/0173947 | A1 | * | 7/2012 | Voicila et al. | 714/752 |

OTHER PUBLICATIONS

Shrader et al., On packet lengths and overhead for random linear coding over the erasure channel, Apr. 6, 2007, cs.IT, pp. 1-5.*
C. E. Shannon, "A Mathematical Theory of Communication," Bell System Technical Journal, vol. 27, pp. 379-423, 1948.
R. Ahlswede, N. Cai, S.-Y. R. Li, and R. W. Yeung, "Network information flow," IEEE Trans. Inform. Theory, IT-46 (2000), pp. 1204-1216.

(Continued)

*Primary Examiner* — John J Tabone, Jr.
(74) *Attorney, Agent, or Firm* — Brundidge & Stanger, P.C.

(57) ABSTRACT

An apparatus and a method for packet error correction in packet-switched networks is provided. Message packets to be transmitted on a network are subdivided into k symbols over GF(q), and the symbols are then encoded by a symbol-level encoder into a codeword of n>k symbols over GF(q). The codeword is transmitted on the network in a plurality of network packets to a symbol-level decoder, which recovers any symbols lost or corrupted in transmission. Encoding at the symbol level increases the amount of data that can be recovered in any single correction operation. The efficiency of the decoding is also enhanced because the location of symbol errors can be determined prior to decoding.

35 Claims, 7 Drawing Sheets

OTHER PUBLICATIONS

A. J. Viterbi, "Spread Spectrum Communications—Myths and Realities," IEEE Communications Magazine, vol. 17, No. 5, pp. 11-18, May 1979.

R. Bose, Information Theory, Coding and Cryptography, 2nd Ed., Tata-McGraw Hill, New Delhi, Chapter 3, 2008.

R. W. Yeung and N. Cai, "Network error correction, part I: Basic concepts and upper bounds," Commun. Inf. Syst., vol. 6, No. 1, pp. 19-36, 2006.

N. Cai and R. W. Yeung, "Network error correction, part II: Lower bounds," Commun. Inf. Syst., vol. 6, No. 1, pp. 37-54, 2006.

R. W. Yeung and Z. Zhang, "Distributed source coding for satellite communications," IEEE Trans. Inform. Theory, IT-45 (1999), pp. 1111-1120.

Guterl, F., "Compact Disc," IEEE Spectrum, vol. 25, No. 11, pp. 102-108, 1988.

* cited by examiner

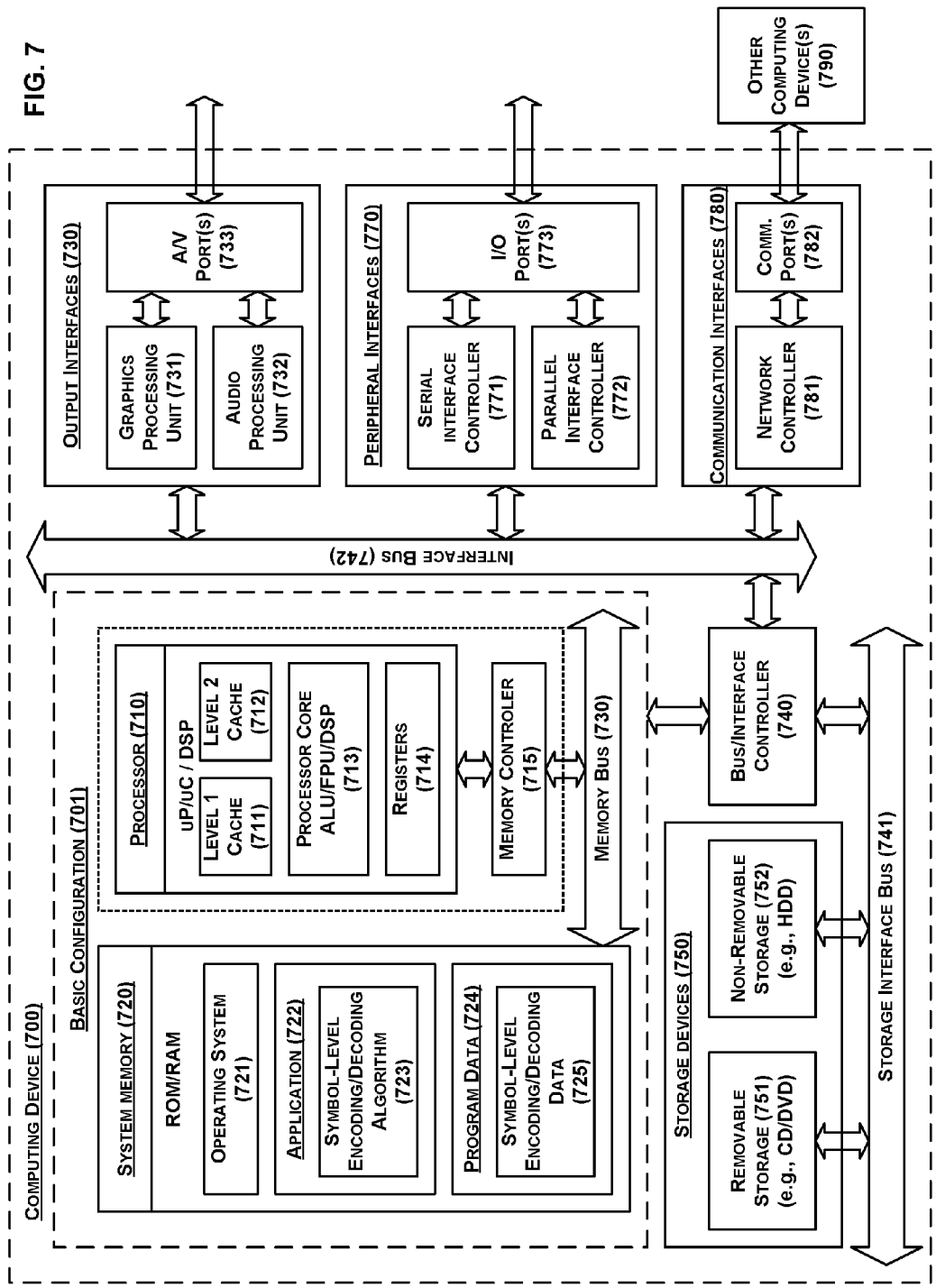

PACKET ERROR CORRECTION IN NETWORKS

CROSS REFERENCE TO RELATED APPLICATIONS

This application claims priority to Indian Patent Application Serial No. 858/DEL/2010 filed Apr. 7, 2010, the contents of which are incorporated by reference herein in its entirety.

BACKGROUND

Most communication channels suffer from noise, interference or distortion due to hardware imperfections, physical limitations, or constraints on transmitted power, among other possible factors. As a result, less-than-perfect transmission of data can lead to erroneous or missing data at the receiving end. Errors (including missing data) at the receiving end, in turn, may degrade (or at least impact) the quality of communications. One common way to address the problem of imperfect communication channels is to introduce error-control coding.

The goal of error-control coding is to encode information in such a way that even if the channel (or possibly a storage medium) introduces errors, the receiver can correct the errors and recover the original transmitted information. The basic idea behind error correcting codes is to add a certain amount of redundancy to the message prior to its transmission through the noisy (or otherwise imperfect) channel. This redundancy is basically some extra information that is added in a known manner. The encoded message (or data) when transmitted through the channel might get corrupted due to noise in the channel. However, at the receiver, the original message can be recovered from the corrupted one if the number of errors is within a limit for which the coding strategy has been designed. Thus, by adding redundancy intelligently, the effect of random noise can be diluted to some extent.

Error-control coding is a discipline under the branch of applied mathematics called Information Theory, developed by Claude Shannon in 1948 (C. E. Shannon, "A Mathematical Theory of Communication," *Bell System Technical Journal*, vol. 27, pp. 379-423, 1948). Prior to Shannon's work, conventional wisdom held that channel noise prevented error-free communications. Shannon proved otherwise, showing that channel noise limits the transmission rate, not the error probability. Specifically, Shannon showed that every communications channel has a capacity, C (measured in bits per second), and as long as the transmission rate, R (also in bits per second), is less than C, it is possible to design a virtually error-free communications system using error control codes. Shannon's contribution was to prove the existence of such codes, not the method to find them.

Most error-control techniques address random errors and work at the bit level. The basic mechanism takes the following form. A block encoder takes a block of k bits and replaces it with an n-bit codeword (n>k). For a binary code, there are $2^k$ possible codewords in a codebook. After the channel introduces errors, the received word can be any one of $2^n$ n-bit words of which only $2^k$ are valid codewords. The job of the decoder is to find the codeword that is closest to the received n-bit word.

SUMMARY

In an example, a method of encoding packets in a packet encoding device is provided. The method comprises receiving a message packet at the packet encoding device; subdividing the received message packet into a sequence of k symbols, each of k symbols comprising p>1 bits and each being a symbol in a symbol alphabet defined over GF(q), wherein q is a positive integer; encoding the k symbols into a computed codeword block of n symbols $c_i$, i=[0, . . . , n−1], wherein n>k, wherein the n symbols of the computed codeword block satisfy a family of equations calculated over GF(q) and having parameters q, α and β, wherein each symbol $c_i$ is a symbol in the symbol alphabet defined over GF(q), and wherein α and β are both positive integers, and α specifies a number x≦α of the n symbols that are recoverable by an inverse decoding procedure applied to a modified codeword block that corresponds to the computed codeword block with x of the symbols having undetermined values; packetizing the computed codeword block of n symbols into a sequence of m>1 network packets, each network packet in the sequence including an indicator of its position in the sequence; and transmitting the sequence of network packets on a network communicatively coupled with the packet encoding device.

In another example, a packet encoding device is provided. The packet encoding device comprises means for receiving a message packet; means for subdividing the received message packet into a sequence of k symbols, wherein each of k symbols comprises p>1 bits and each is a symbol in a symbol alphabet defined over GF(q), wherein q is a positive integer; means for encoding the k symbols into a computed codeword block of n symbols $c_i$, i=[0, . . . , n−1], wherein n>k, wherein the n symbols of the computed codeword block satisfy a family of equations calculated over GF(q) and having parameters q, α and β, wherein each symbol $c_i$ is a symbol in the symbol alphabet defined over GF(q), and wherein α and β are both positive integers, and α specifies a number x≦α of the n symbols that are recoverable by an inverse decoding procedure applied to a modified codeword block that corresponds to the computed codeword block with x of the symbols having undetermined values; means for packetizing the computed codeword block of n symbols into a sequence of m>1 network packets, wherein each network packet in the sequence includes an indicator of its position in the sequence; and means for transmitting the sequence of network packets on a network with which the packet encoding device is configured to be communicatively coupled.

In yet another example, a tangible computer-readable medium provided. The tangible computer-readable medium has instructions stored thereon that, upon execution by a packet encoding device, cause the packet encoding device to carry out functions comprising receiving a message packet; subdividing the received message packet into a sequence of k symbols, wherein each of k symbols comprises p>1 bits and each is a symbol in a symbol alphabet defined over GF(q), wherein q is a positive integer; encoding the k symbols into a computed codeword block of n symbols $c_i$, i=[0, . . . , n−1], wherein n>k, wherein the n symbols of the computed codeword block satisfy a family of equations calculated over GF(q) and having parameters q, α and β, wherein each symbol $c_i$ is a symbol in the symbol alphabet defined over GF(q), and wherein α and β are both positive integers, and α specifies a number x≦α of the n symbols that are recoverable by an inverse decoding procedure applied to a modified codeword block that corresponds to the computed codeword block with x of the symbols having undetermined values; packetizing the computed codeword block of n symbols into a sequence of m>1 network packets, wherein each network packet in the sequence includes an indicator of its position in the sequence; transmitting the sequence of network packets on a network to which the encoding device is configured to be communicatively coupled.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The embodiments will be further elucidated by means of the following description and the appended drawings.

FIG. 7 is a block diagram illustrating an example apparatus for carrying out symbol-level error correction encoding and decoding in accordance with an example embodiment of the present application.

DETAILED DESCRIPTION

Figure 1:
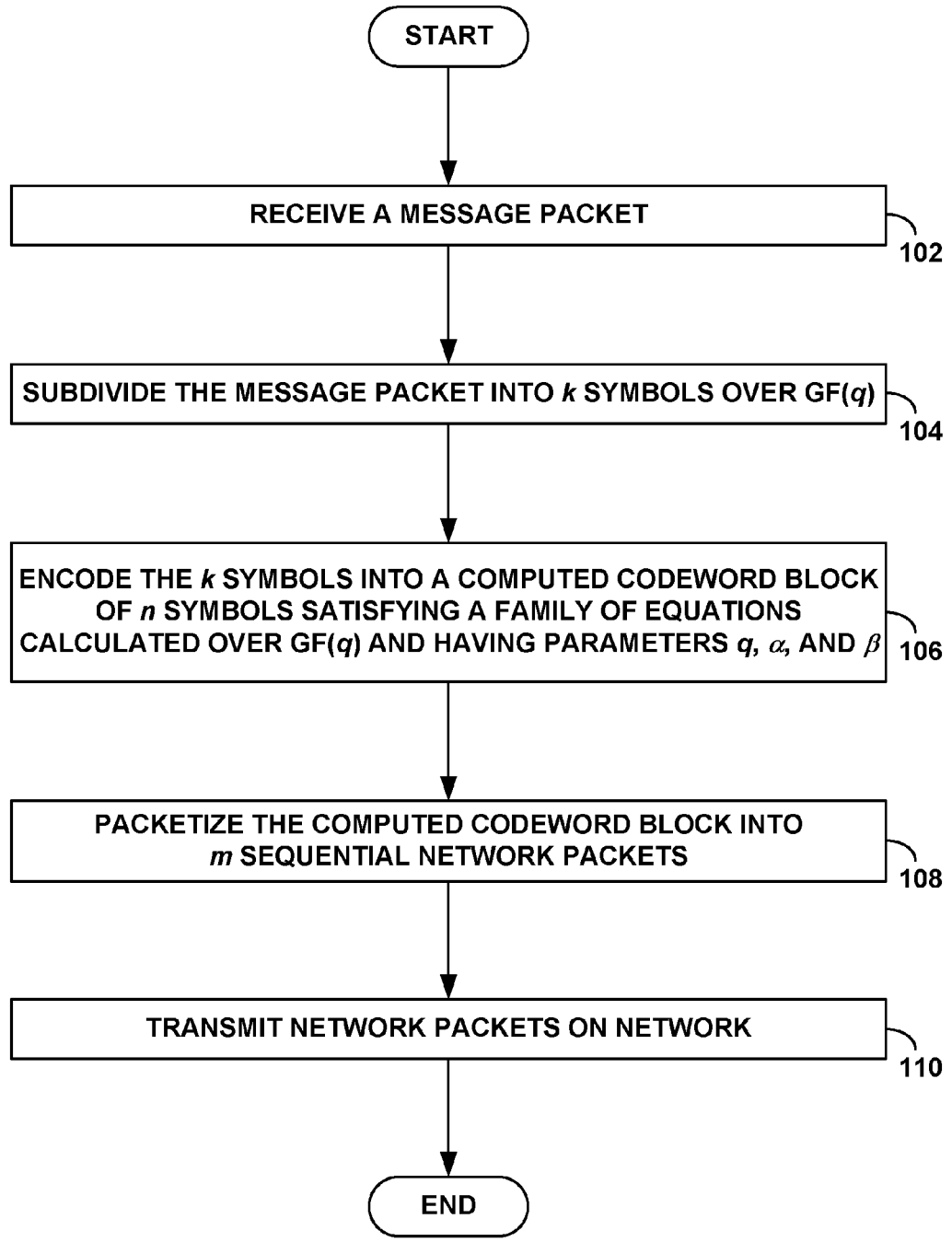
FIG. 1 is a flowchart illustrating an example method of packet error correction encoding in accordance with an example embodiment of the present application.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

An embodiment provides an apparatus and a method for packet error correction in packet-switched networks.

Today large volumes of data are transported over packet switched networks in which messages are divided into packets before they are sent. Each packet is then transmitted individually. The packets may follow different routes to the destination, where they are recompiled into the original message. Due to channel conditions, network congestions, memory overflow and noise, some packets may get dropped in the network and not reach the intended destination. Others may be received with errors. For many applications running on such networks, the packets in error ultimately result in poorer quality of service.

All current error-control techniques operate under an assumption that errors occur only randomly. Under this assumption, the locations of errors within a communication stream are not known at the destination prior to application of error correction. The conventional approach of treating all errors as random and the locations of errors as unknown at the destination constrains the techniques and efficiency of error correction.

In practice, however, each packet transmitted on a network to a destination is numbered prior to transmission. Consequently, when packets get corrupted or dropped enroute to their destination, the locations of the erroneous packet(s) can be determined. For example, if the Cyclic Redundancy Check (CRC) is not valid for the $n^{th}$ packet, the packet at location n can be declared in error. This location information reduces the randomness of errors, and is one of the bases of error correction techniques introduced in embodiments of the present application.

Current error correcting techniques also typically work at the bit level. As is well-known in the art, bit level implementation implies the arithmetic is carried over a Galois Field of order two, designated GF(2). Such techniques are limited to correction of individual bit errors. That is any given determined correction can at most change a one to a zero, or vice versa (wherein an individual bit can have a value of one or zero).

In an embodiment of an error correction technique, redundancy is added at the symbol level, wherein a symbol comprises a plurality of bits. As such, this technique employs arithmetic carried out over higher order Galois Fields, designated GF(q), wherein q is a positive integer that is related to the number of bits in each symbol. Thus any correction of an individual symbol after being received in error at a destination recovers multiple bits, as opposed to just one bit of conventional error correction. This symbol-level error correction therefore advantageously yields improved efficiency over bit-level error correction techniques.

By implementing symbol-level error correction for larger values of q, the efficiency gain can be correspondingly improved. Indeed, as practical limitations to the size of q such as computational efficiency and hardware execution speed (among possibly others) are overcome, the sizes of symbols to which symbol-level error correction can be applied will correspondingly increase. Thus, symbol size may approach that of individual data packets, so that the error correction techniques of this embodiment, can in principle, provide error protection at the packet level. Accordingly, the symbol-level error correction described herein may also be considered as a form of packet-level error correction.

1. Example Method of Packet Error Correction

FIG. 1 is a flowchart illustrating an example method of packet error-correction encoding in accordance with an example embodiment of the present application. More particularly, FIG. 1 illustrates a method of encoding packets by a packet encoding device using symbol-level error correction. In practice, the packet encoding device could function cooperatively with or be integrated into a communication device in a network. As such, the packet encoding device would be communicatively coupled with the network, and thus able to transmit packets on the network and receive packets from the network. As just one example, the packet encoding device could be part of a computer connected to and communicating on a packet-switched network. Additional details of an example packet encoding device are described below.

At step 102, the packet encoding device receives a message packet. In accordance with an example embodiment, the packet encoding device will receive message packets from an upper layer of a network or communication protocol stack, such as an application layer, and will encode the message packet for transmission on the network in one or more network packets. By way of example, a network packet could be an IP packet and the network could be the Internet. As another example, a network packet could be an ATM packet, and the network could be an ATM network. These examples are not intended to be limiting with respect to this application or embodiments thereof.

At step 104, the packet encoding device subdivides the message packet into k symbols over GF(q). More specifically, each of the k symbols comprises p bits, wherein p is greater than one (p>1), and each of the k symbols is a symbol in a symbol alphabet defined over GF(q), wherein q is a positive integer. As is known in the art, q defines the order of the Galois Field (GF), and as such, the symbol alphabet defined over GF(q) consists of integers in the range $[0, \ldots, q-1]$. For example, taking q=11, the symbol alphabet consists of the integers [0, 1, 2, 3, 4, 5, 6, 7, 8, 9, 10], each of which can be represented by p=4 bits. Note that while four bits can accommodate integers in the range $[0, \ldots, 15]$, the alphabet over GF(11) does not actually employ every one of the $2^4=16$ bit combinations of p=4 bits. In this sense, p defines the minimum number of bits required to define the symbol alphabet defined over GF(q).

At step 106, the k symbols are encoded into a computed codeword block of n symbols that satisfy a family of equations calculated over GF(q) and having parameters q, $\alpha$ and $\beta$. The n symbols are designated $c_i$, $i=[0, \ldots, n-1]$, and in accordance with the method of the example embodiment, n>k. Also in accordance with the method of the example embodiment, each symbol $c_i$ is a symbol in the symbol alphabet defined over GF(q). And in further accordance with the method of the example embodiment, $\alpha$ and $\beta$ are both positive integers, and a specifies a number $x \leq \alpha$ of the n symbols that are recoverable by an inverse decoding procedure.

More specifically, for a modified codeword block that corresponds to the computed codeword block with x of the symbols having undetermined values, the inverse decoding procedure can recover up to $\alpha$ of the n symbols. For instance, if $x \leq \alpha$ of the n symbols of the computed codeword block are lost or corrupted in transmission, the inverse decoding procedure could recover them. It will be appreciated that encoding the k symbols into the computed codeword block of n symbols also involves determining a value of n sufficiently large to make $\alpha$ of the n symbols recoverable by the inverse decoding procedure when applied to the modified codeword block with $x=\alpha$. Additional details of the family of equations satisfied by the n symbols of the computed codeword block are discussed below.

At step 108, the computed codeword block is packetized into m sequential network packets, and at step 110, the packets are transmitted on the network. In accordance with the method of the example embodiment, m>1 and each network packet in the sequence includes an indicator of its position in the sequence. For example, each packet could carry a sequence number. As noted above, network packets could be IP packets transmitted on an IP network, or ATM packets transmitted on an ATM network. Other types of networks and network packets are possible as well. Additional examples could include wireless networks, cellular wireless air interface links, and satellite communication links.

In further accordance with the example embodiment, transmitting the sequence of network packets on the network comprises transmitting the sequence of network packets to a packet decoding device that is operable to perform the decoding procedure and is communicatively connected with the packet encoding device by way of the network. Thus while the method illustrated in FIG. 1 specifies packet encoding by a packet encoding device, it will be appreciated that a packet decoding device that receives network packets carrying encoded data and having been transmitted according to the above description can apply the inverse decoding procedure to the received network packets to recover the original message packet of step 102.

In particular, encoding the k symbols (at step 106) into the computed codeword block of n symbols comprises arranging the n symbols in a defined sequence within the computed codeword block so that each of the n symbols occupies a known position in the computed codeword block. Since each of the m transmitted network packets carries a sequence number (or other indicator of sequence position), the receiving packet decoding device can determine the position of any missing or corrupted network packet in the sequence of m network packets, and can thereby determine the position of any missing or corrupted symbol in a codeword block reconstructed from the received network packets. A missing or corrupted symbol may be considered as a symbol that has an undetermined value. Applying the inverse decoding procedure to the thus-reconstructed codeword block, the decoding device can recover the original computed codeword block generated by the packet encoding method, including any (up to $\alpha$) symbols having unassigned values. Further details of the decoding device are described below.

While the example method of FIG. 1 is described with respect to just one message packet received at the packet encoding device, it will be appreciated network communications typically involve multiple message packets. Hence, the example method can be applied to multiple message packets, and in particular, multiple message packets that arrive at the packet encoding device from one or more upper layers of a network or communication protocol stack (such as one or more applications).

It will also be appreciated that the steps described above illustrate by way of example a packet encoding method of an embodiment of the present application. Additional and/or alternative steps could be included while remaining within the scope and spirit of the present application. For example, packetizing the computed codeword block of n symbols into the sequence of m>1 network packets could also comprise interleaving the n symbols across the sequence of m>1 network packets. In event of a lost or corrupted packet, interleaving would spread out lost or corrupted symbols across the reconstructed codeword.

Figure 2:
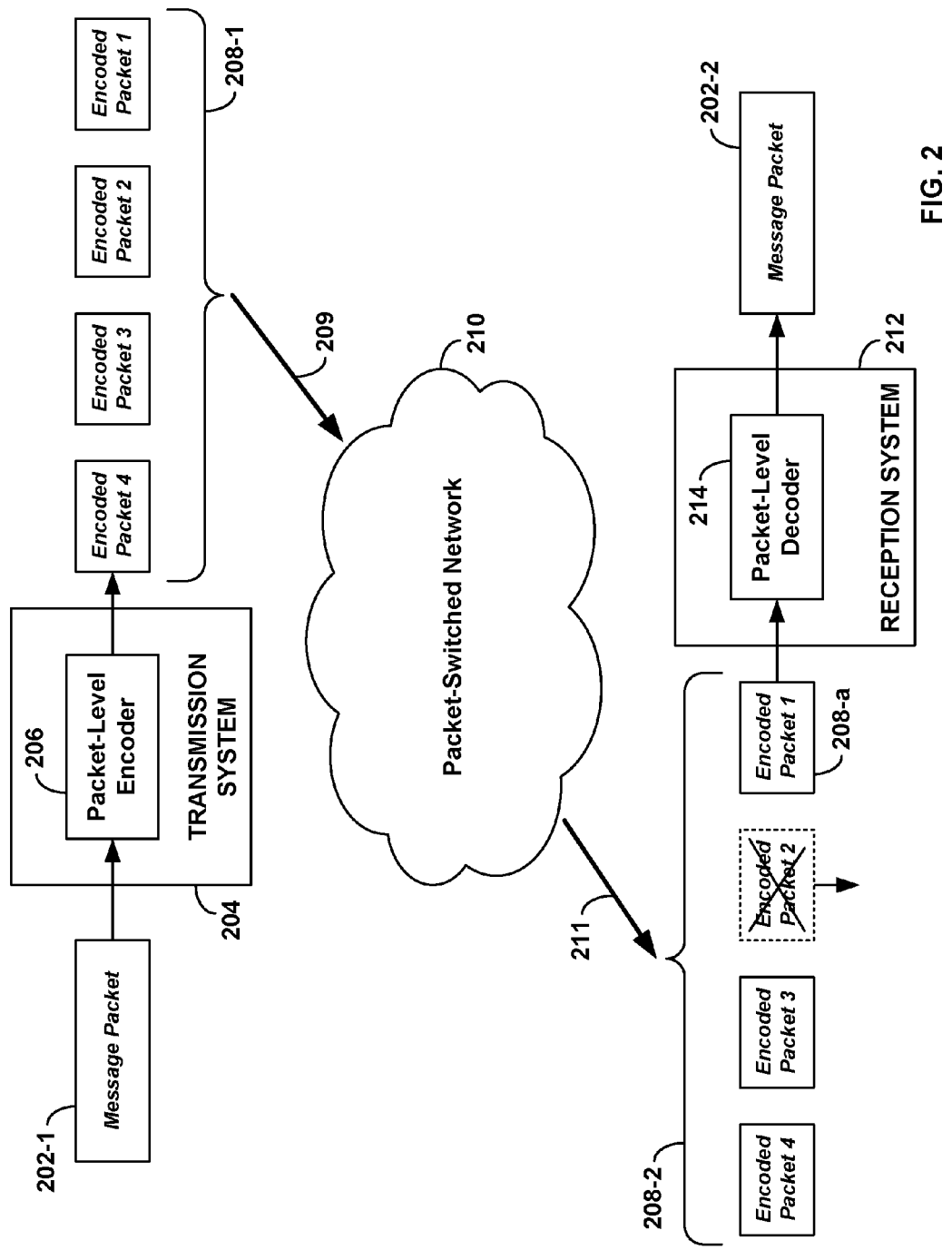
FIG. 2 illustrates high-level concepts of packet error correction in a network carried out in accordance with an example embodiment of the present application.

FIG. 2 illustrates high-level concepts of packet error correction in a network carried out in accordance with an example embodiment of the present application. As such, the figure provides an example context for the packet encoding device, the packet decoding device, and the example method illustrated in FIG. 1 and discussed above. As shown in FIG. 2, a message packet 202-1 is received at the packet-level encoder 206 of a transmission system 204. The transmission system could be a computer, router, or other device capable of packet communications on a communication network.

The packet-level encoder 206, which corresponds to the packet encoding device discussed in FIG. 1, encodes the message packet 202-1 in accordance with the example packet encoding method described above in connection with FIG. 1. As shown, the message packet 202-1 is encoded into four network packets 208-1, labeled "Encoded Packet 1," "Encoded Packet 2," "Encoded Packet 3," and "Encoded Packet 4," wherein m=4 network packets by way of example.

The network packets 208-1 are transmitted 209 on a packet-switched network 210, and received 211 as network packets 208-2 at a reception system 212. Note that the "-1" and "-2" appended to the network packet labels are meant to distinguish the network packets 208-1 at the transmission source from those (208-2) at the receiving destination. If there is no packet loss or corruption, network packets 208-1 and network packets 208-2 would be the same. In order to illustrate the example embodiment, however, it is assumed by way of example that "Encoded Packet 2" is lost or corrupted in transmission. This is represented in FIG. 2 by the "X" through the packet label and the downward arrow from the packet (redrawn with a dotted line).

Network packets 208-2 thus arrive at the packet-level decoder 214 of the reception system 212, but with "Encoded Packet 2" missing or corrupted. The packet-level decoder 214, which corresponds to the packet decoding device discussed in FIG. 1, decodes the message packet 202-1 in accordance with the decoding procedure of the example method described above in connection with FIG. 1. In accordance with the example method, the symbols carried in "Encoded Packet 2" are recovered, and the original message packet, now relabeled 202-2 is delivered as output from the packet level decoder 214. As with the network packets, the "-1" and "-2" appended to the message packet labels are meant to distinguish the message packet 202-1 at the transmission source from message packet 202-2 at the receiving destination. Because of the error correction encoding the packet level decoder 214 recovers the original message packet, so that message packet 202-1 is same as message packet 202-2.

It will be appreciated that the illustration of FIG. 2 is a high-level and simplified view of error correction encoding and decoding according to an example embodiment of the present application. Further details of symbol-level error correction, as well as example operation of symbol-level error correction and an example implementation of an embodiment of the present application, are discussed below.

2. Symbol-Level Error Correction

The principle of symbol-level error correction may be illustrated by way of example by considering a packet code over GF(11). That is, all the codeword symbols $c_i$ are taken from GF(q), wherein q=11. As indicated above, the symbol alphabet (i.e. the codeword symbols) will then consist of the integers [0, 1, 2, 3, 4, 5, 6, 7, 8, 9, 10]. Also by way of example, the codeword block length, n, is taken to be ten (n=10). In order to provide error correction for one error in a given codeword block, the codeword must be constructed such that the n symbols in the codeword block satisfy the equation:

$$\sum_{i=0}^{9}(10-i)c_i = 0 \text{ calculated (mod } 11) \tag{1}$$

It will be appreciated that "mod 11" refers to the arithmetic remainder after integer division of the computed sum by 11 (more generally, "a mod b" refers to the arithmetic remainder after integer division of a by b).

One possible codeword that satisfies equation (1) is: 0 0 7 0 4 8 2 9 7 7. This can be verified by explicitly expanding the sum and determining the remainder after dividing by 11. Specifically:

(10×0+9×0+8×7+7×0+6×4+5×8+4×2+3×9+2×7+1×7) mod 11=176=mod 11=0, since 176÷11=16 with no remainder (i.e., remainder=0). Thus this is a valid codeword.

Now suppose this codeword is transported over a network and the $7^{th}$ symbol is dropped or corrupted, so that the received codeword is 0 0 7 0 4 8 e 9 7 7, where e represents a codeword symbol now of undetermined value. The erroneous (undetermined) symbol, e, can be recovered by solving equation (1). That is a solution is sought for:

(10×0+9×0+8×7+7×0+6×4+5×8+4×e+3×9+2×7+1×7) mod 11=0. (2)

The solution of equation (2) with one unknown yields e=2. Note that in solving equation (2), it is known a priori that a particular codeword symbol is in error (the $7^{th}$ symbol in this example). Thus, it is possible to correct a single error in the received codeword simply because the location of the erroneous symbol in the codeword block is known.

Equation (1) represents the process of encoding, since the symbols of the codeword are chosen to ensure that equation (1) is satisfied. Correspondingly, solving equation (2) represents the inverse process of decoding, since the erroneous symbol is recovered by solving for e. Notice that each symbol comprises p=4 bits, so that, in this example, the recovery of e by equation (2) yields bits 0010 (wherein the most significant bit is on the left). Thus even this simple example illustrates the advantage of the present method over bit-level error correction, which can only recover a single bit for any given correction. The advantage increases as q (or the bits per symbol) increases.

Continuing with the present example, it is possible to provide error correction for two symbols by constructing the codeword block to satisfy two equations, given by:

$$\sum_{i=0}^{9}(10-i)^2 c_i = 0 \text{ calculated (mod } 11) \tag{3a}$$

$$\sum_{i=0}^{9}(10-i)c_i = 0 \text{ calculated (mod } 11) \tag{3b}$$

It can be demonstrated more generally that for a given codeword block of n symbols, a number x≦α of the n symbols are recoverable by the inverse decoding procedure if the codeword block is constructed so that its symbols satisfy a family of equations given by:

$$\sum_{i=0}^{n-1}((q-\beta)-i)^\alpha c_i = 0 \text{ calculated over } GF(q). \tag{4}$$

In equation (4), α and β are both positive integers. It will be appreciated that α and β provide algebraic constraints to the family of equations, such that for a symbol alphabet (or "codebook") defined over GF(q), the given codeword block can be constructed to satisfy a separate equations corresponding to Equation (4), namely:

$$\sum_{i=0}^{n-1}((q-\beta)-i)^\alpha c_i = 0 \tag{5}$$

$$\sum_{i=0}^{n-1}((q-\beta)-i)^{\alpha-1} c_i = 0$$

$$\vdots$$

$$\sum_{i=0}^{n-1}((q-\beta)-i)c_i = 0,$$

Each of the individual equations of equation (5) is calculated modulo q.

In the example method of equations (1) and (2), the implied determination by the receiving end that one of the symbols (the 7th in this example) is in error seems to suggest that each of the n=10 symbols of the example codeword are individually transmitted. While it is possible to transmit each symbol of the encoder-constructed codeword separately, for example each in its own network packet, a more practical arrangement is one in which the codeword is subdivided into network packets, each of which carries a plurality of codeword symbols. For example, if p=4 and n=256, then the total number of bits in a codeword would be 4×256=1,024, or 128 bytes (at eight bits per byte). For a network packet with a presumed 32-byte payload size, the codeword could be packetized into four such network packets. It will be appreciated that these are just examples of p, n, packet size, and number of network packets per codeword block, and that other sizes could be used as well.

3. Example Operation of Symbol-Level Error Correction

Symbol-level error correction in accordance with example embodiments of the present application may be further understood by considering an example operation. As noted, in a practical implementation of a method and apparatus for symbol-level error correction, a codeword can be subdivided and packetized into more than one network packet. By way of a further example, a Galois Field of order q=128 could be used. In this case, p=8, or each symbol is one byte in size, and the symbol alphabet includes the integers $[0, \ldots, 127]$. If a message packet contains 128 bytes, then it can be represented by k=128 symbols.

In accordance with the example embodiments described herein, the packet encoder subdivides the message packet into k symbols (k=128 in the present example) simply taking each one of the successive bytes of the message packet to be a symbol. Note that a given message packet subdivided in this way will not necessarily use every one of the unique symbols; it is possible that some symbols will appear more than once in a given sequence of symbols corresponding to the message packet. Once the k symbols are determined, they are encoded into an n-symbol codeword block wherein n>k. The n-symbol codeword block is then packetized into m network packets, which are transmitted on the network.

The encoder can packetize the n-symbol codeword block either by placing successive symbols of the codeword into the payloads of successive network packets (m total), or by interleaving the n symbols among the m network packets. For example, if n=200, m=4 and interleaving is not used, then a codeword $C=\{c_1, c_2, c_3, \ldots, c_{200}\}$ is packetized into network packet payloads as $P_1=\{c_1, c_2, c_3, \ldots, c_{50}\}$, $P_2=\{c_{51}, c_{52}, c_{53}, \ldots, c_{100}\}$, $P_3=\{c_{101}, c_{102}, c_{103}, \ldots, c_{150}\}$, $P_4=\{c_{151}, c_{152}, c_{153}, \ldots, c_{200}\}$. If an entire network packet is lost or corrupted during transmission, an entire sequence of symbols in the received codeword is correspondingly lost or corrupted.

When interleaving is used, the same codeword is packetized into network packet payloads as $P_1=\{c_1, c_5, c_9, \ldots, c_{197}\}$, $P_2=\{c_2, c_6, c_{10}, \ldots, c_{198}\}$, $P_3=\{c_3, c_7, c_{11}, \ldots, c_{199}\}$, $P_4=\{c_4, c_8, c_{12}, \ldots, c_{200}\}$. Note that in this instance, m corresponds to what is commonly referred to as the interleaving depth. Interleaving spreads out the symbols over the network packets so that if any one network packet is lost or corrupted in transmission, the correspondingly lost or corrupted symbols are spread out over the received codeword. This can help reduce the impact of errors and further improve the recovery of the lost symbols.

Figure 3:
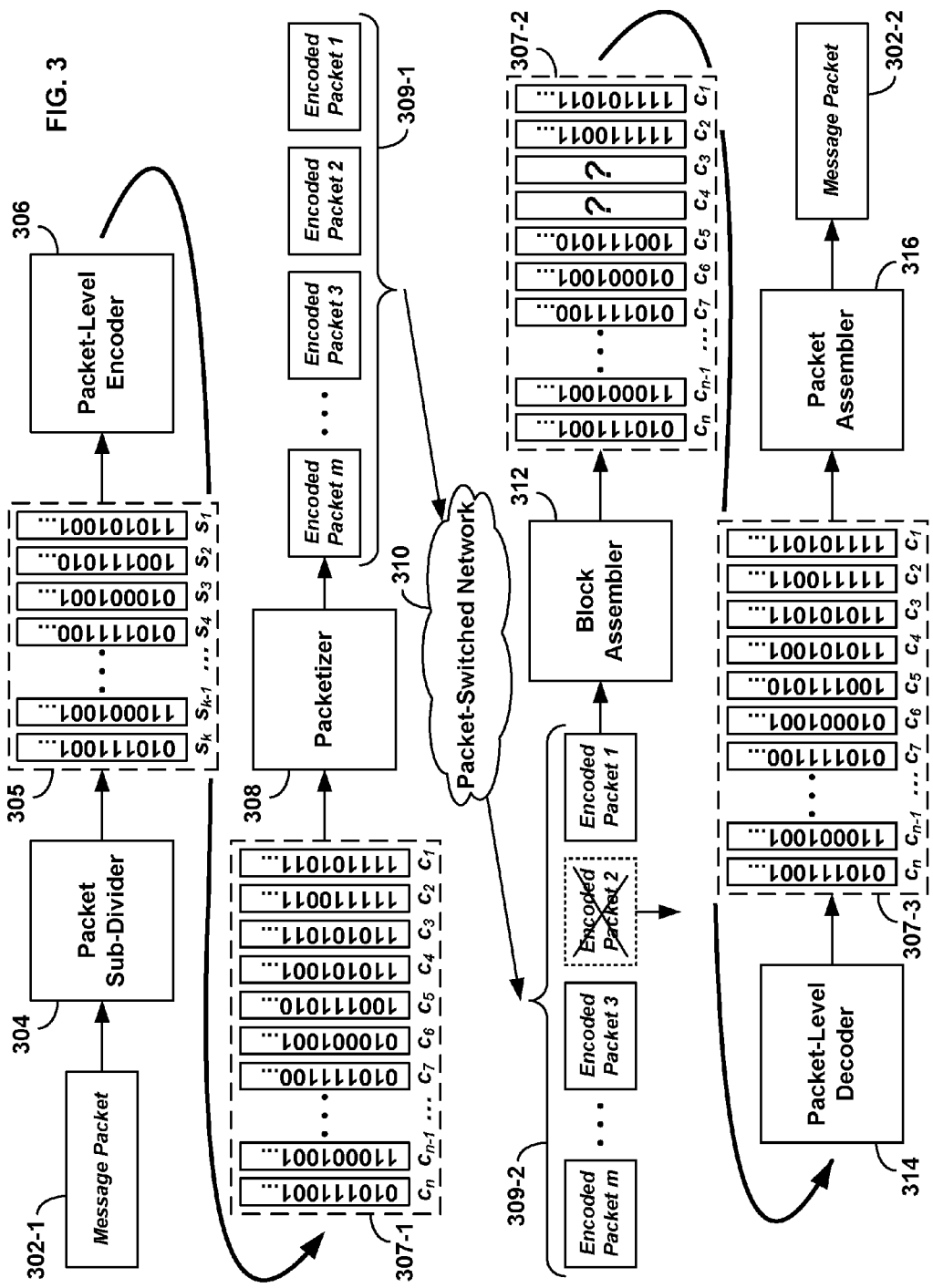
FIG. 3 illustrates operation of packet error correction without symbol interleaving carried out in accordance with an example embodiment of the present application.

FIG. 3 illustrates operation of packet error correction without symbol interleaving carried out in accordance with an example embodiment of the present application. A message packet 302-1 arrives at packet sub-divider 304, which subdivides the message packet into a symbol sequence 305 comprising k symbols $s_1, s_2, \ldots s_k$. The message packet could have been generated from a communication application or other upper-layer source. In the figure, the symbols are represented as strings of ones and zeros in vertically-oriented rectangles. It should be understood that the particular strings are meant to signify bits, but the particular bit values are arbitrary and only meant to be emblematic of symbol elements.

The symbol sequence 305 is received at a packet-level encoder 306, which then encodes the sequence into an n-symbol codeword block 307-1 comprising k symbols $c_1, c_2, \ldots c_n$. The codeword block 307-1 is supplied to packetizer 308, which generates and transmits network m packets 309-1. As shown, the network packets are labeled "Encoded Packet 1," "Encoded Packet 2," "Encoded Packet 3," ..., "Encoded Packet m." The network packets 309-1 are transported on packet-switch network 310, and arrive as network packets 309-2 at block assembler 312.

By way of example, Encoded Packet 2 of the transmitted network packets 309-1 is lost or corrupted in the received network packets 309-2. This represented by the "X" through the packet label and the downward arrow from the packet (redrawn with a dotted line). Consequently, when the block assembler 312 reconstructs the received codeword block 307-2, certain consecutive symbols have undefined values. Note that each network packet includes a sequence number (or some other indication of position in the sequence of network packet), so that the block assembler can properly sequence the received symbols. In the present example, these lost or corrupted symbols are represented by question marks ("?") in symbols $c_3$ and $c_4$ of the received codeword block 307-2. The symbols depicted as missing are intended to represent consecutive symbols in the lost packet, Encoded Packet 2. However, the particular indices ($c_3$ and $c_4$) are arbitrary, and not intended to specify that Encoded Packet 2 necessarily carried only these two symbols.

The received codeword block 307-2 is supplied to a packet-level encoder 314, which applies the inverse decoding procedure described above. The result is recovered codeword block 307-3 in which the undefined symbols $c_3$ and $c_4$ have been corrected (recovered), so that recovered codeword block 307-3 is the same as the original codeword block 307-1. The recovered codeword block 307-3 is then supplied to a packet assembler 316, which recovers the original sequence of symbols $s_1, s_2, \ldots s_k$ and reconstructs the received message packet 302-2. The received message packet 302-2, which is the same as the original message packet 302-1, can then be delivered to an upper-layer application or other upper-layer function.

Figure 4:
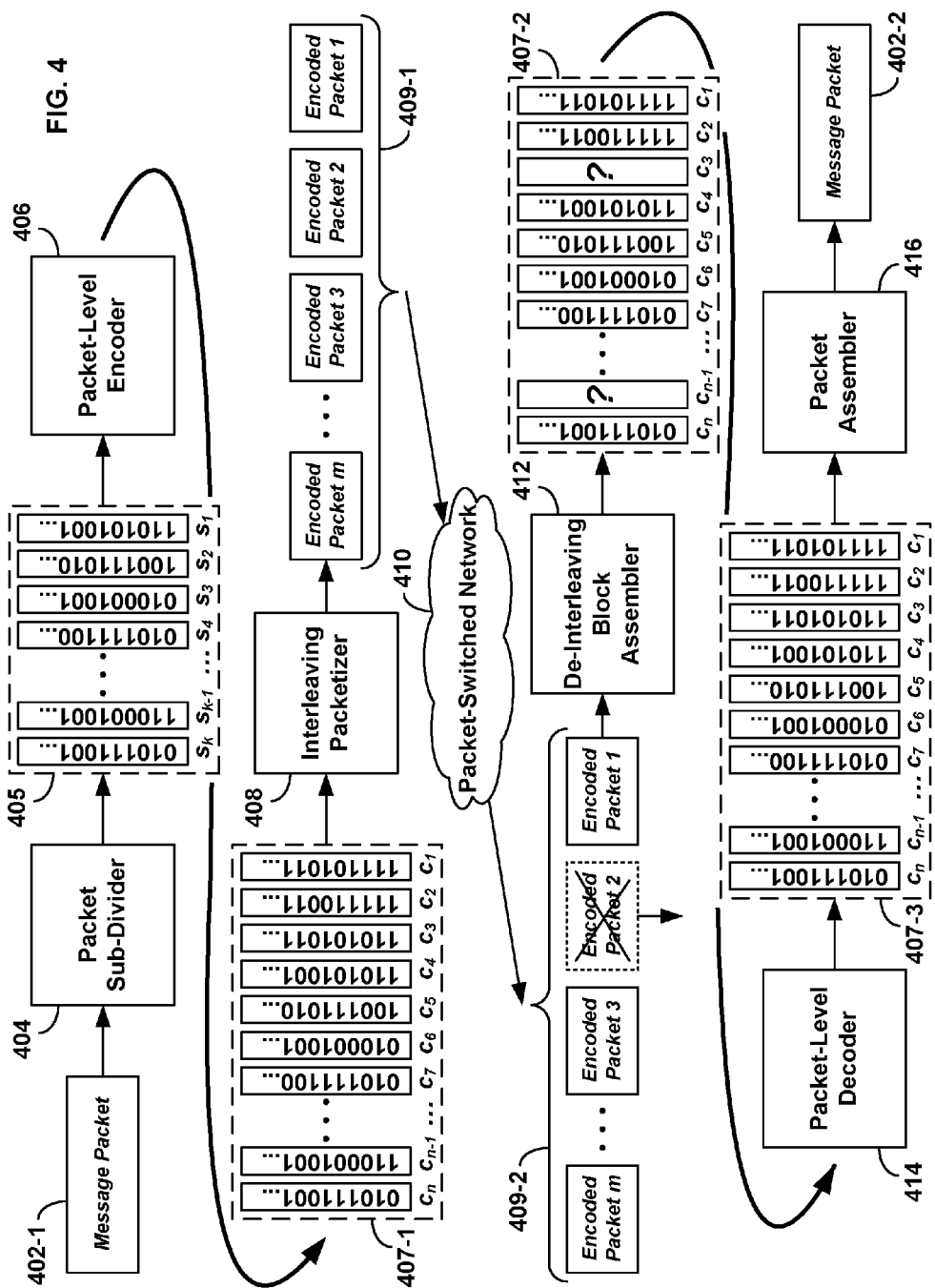
FIG. 4 illustrates operation of packet error correction with symbol interleaving carried out in accordance with an example embodiment of the present application.

FIG. 4 illustrates operation of packet error correction with symbol interleaving carried out in accordance with an example embodiment of the present application. The depiction in FIG. 4 is largely the same as that in FIG. 3, except that all of the numerical item labels begin with "4" (e.g., "402-1," "404," etc.), so that the description for FIG. 3 largely applies to FIG. 4 as well. However, FIG. 4 includes an interleaving packetizer 408 (instead of packetizer 308) and a de-interleaving block assembler 412 (instead of block assembler 312).

The interleaving packetizer interleaves 408 interleaves the n symbols of codeword block 407-1 across the m network packets 409-1. Consequently, when the de-interleaving block assembler 412 de-interleaves the received network packets 409-2 in which Encoded Packet 2 has (again, by way of example) been lost or corrupted, the erroneous symbols are now spread out across the receive codeword block 407-2. This is depicted by question marks in symbols c2 and $c_{n-1}$ of the receive codeword block 407-2. As in the example of FIG. 3, the sequence numbers in the received network packets enables the de-interleaving block assembler 412 to properly sequence the received symbols.

As with the operation illustrated in FIG. 3, the receive codeword block 407-2 is supplied to the packet level decoder 414, which applies the inverse decoding procedure to generate recovered codeword block 407-3 in which the undefined symbols c2 and $c_{n-1}$ have been corrected (recovered), so that recovered codeword block 407-3 is the same as the original codeword block 407-1. The recovered codeword block 407-3 is then supplied to a packet assembler 416, which recovers the original sequence of symbols $s_1, s_2, \ldots s_k$ and reconstructs the received message packet 402-2. The received message packet 402-2, which is the same as the original message packet 402-1, can then be delivered to an upper-layer application or other upper-layer function.

4. Example Implementation of an Embodiment

The operation of error-control encoding illustrated in FIGS. 3 and 4 can be implemented as computer-executable instructions carried out by one or more processing elements of a packet encoding device. Similarly, the operation of error-control decoding illustrated in FIGS. 3 and 4 can be implemented as computer-executable instructions carried out by one or more processing elements of a packet decoding device. In practice, a single device could combine both packet encoding and decoding. Example implementations of logical instructions for carrying out both packet encoding and packet decoding are described below. For purposes of illustration, encoding and decoding are described separately. An example implementation of a device for carrying both encoding and decoding is described subsequently.

Figure 5:
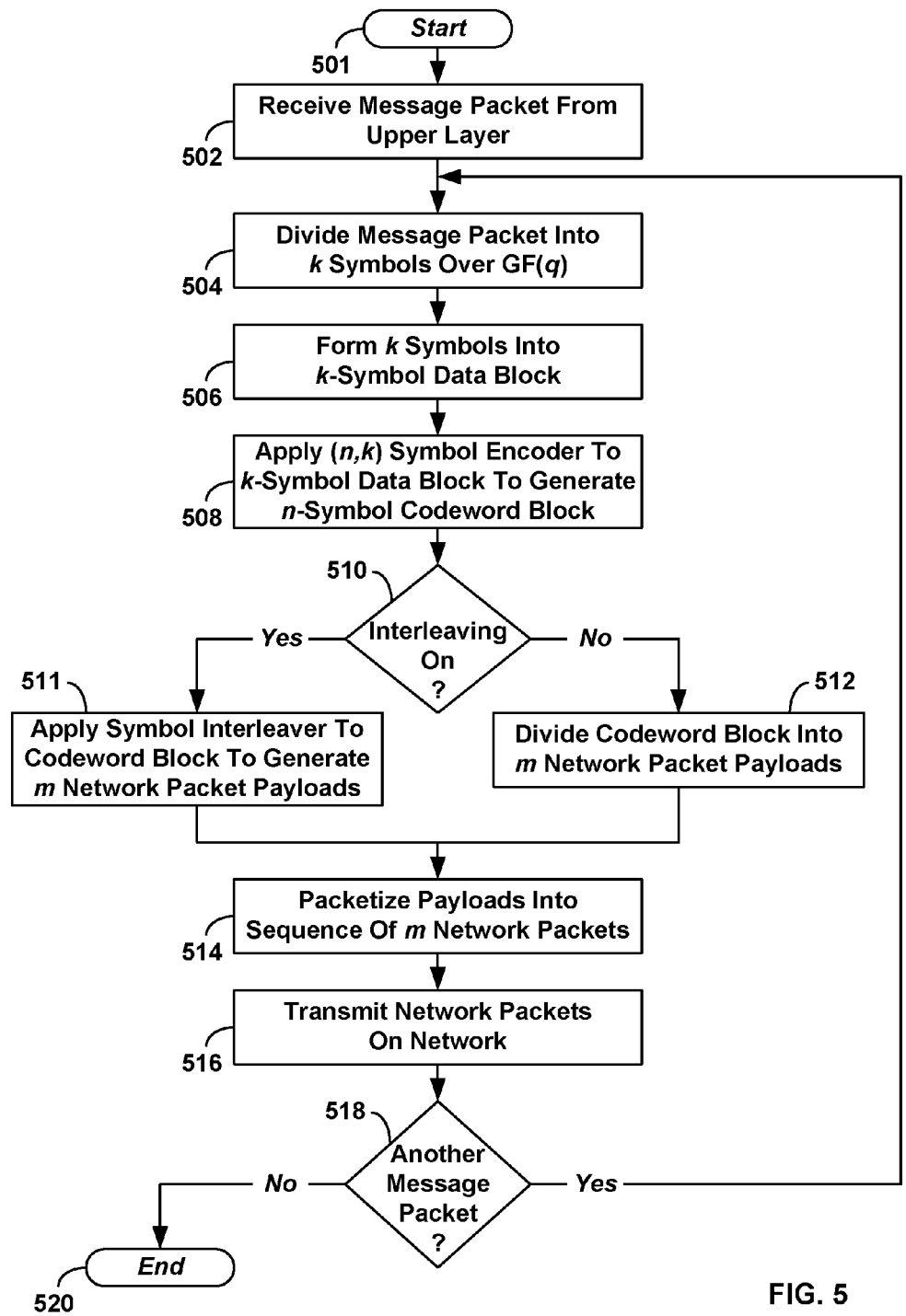
FIG. 5 illustrates an example of logical steps for implementing symbol-level error correction encoding in accordance with an example embodiment of the present application.

FIG. 5 illustrates an example of logical steps for implementing symbol-level error correction encoding in accordance with an example embodiment of the present application. These steps could be implemented in the form of computer-executable instructions stored on a tangible, computer-readable medium. When executed by one or more processors of a packet encoding device, the device would then be caused to carry out the steps.

At step 502, following start step 501, a message packet is received at the encoding device. For example, a message packet could be received from an upper-layer application. At step 504, the message packet is divided into a sequence of k symbols over GF(q) and at step 506, the k consecutive symbols are formed into a k-symbol data block.

At step 508 an (n,k) symbol encoder is applied to the k-symbol data block to generate an n-symbol codeword block in a manner as described above, for example in connection with equation (4). As described, the codeword block encodes the redundancy that will allow a decoder that receives a codeword with errors to recover the original codeword.

At step 510, a determination is made as to whether interleaving is being used for packetizing the codeword. If interleaving is being used ("Yes" branch from step 510), a symbol interleaver is applied to the codeword block at step 511 to generate m network packet payloads of interleaved symbols. If interleaving is not being used ("No" branch from step 510), the codeword block is divided into m sequential sub-blocks at step 512 to generate m network packet payloads of symbols.

The m network packet payloads from either of steps 511 or 512 are then packetized into a sequence of m network packets at step 514, which are then transmitted on the network at step 516.

Finally, at step 518, a determination is made as to whether there is another message packet waiting to be encoded. If there is ("Yes" branch from step 518), the process returns to step 504 and repeats. If there is not another message packet waiting ("No" branch from step 518), the process ends at step 520.

Figure 6:
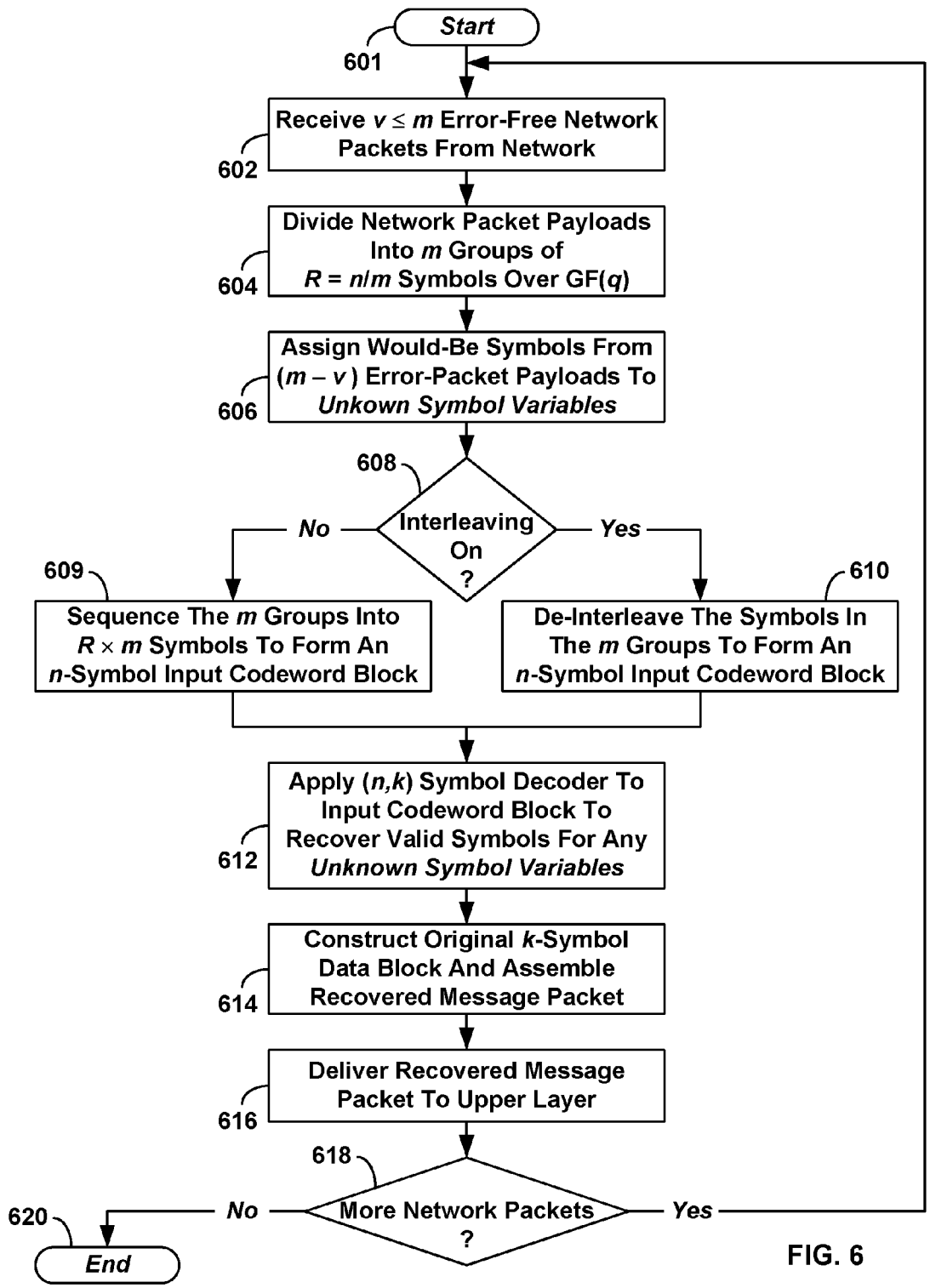
FIG. 6 illustrates an example of logical steps for implementing symbol-level error correction decoding in accordance with an example embodiment of the present application.

FIG. 6 illustrates an example of logical steps for implementing symbol-level error correction decoding in accordance with an example embodiment of the present application. These steps could be implemented in the form of computer-executable instructions stored on a tangible, computer-readable medium. When executed by one or more processors of a packet decoding device, the device would then be caused to carry out the steps.

At step 602, following start step 601, a number $v \leq m$ of error-free network packets is received at the decoding device from the network. By way of example, it is assumed that m network packets were transmitted by the encoding device. To the extent that there is any packet loss or corruption in transmission, $v \leq m$ of them will be received without any errors. Step 602 is assumed to include an error check, such as a CRC check, to determine which (if any) arriving network packets have errors.

At step 604, the payloads of the network packets are arranged into m groups of n/m symbols over GF(q). Of these m groups, v of them have no symbol errors, while R=m−v of them do have symbol errors. At step 606, symbols associated with the m−v groups with errors are assigned as unknown symbol variables. These symbols are referred to as "would-be" symbols since they need to be counted among the total n expected symbols, but their values are undetermined because of transmission errors.

At step 608, a determination is made as to whether interleaving is being used for packetizing the codeword. If interleaving is being used ("Yes" branch from step 608), the m groups of symbols are de-interleaved to form an n-symbol input codeword block at step 610. In the de-interleaved input codeword block the unknown symbols are spread out, as described above. If interleaving is not being used ("No" branch from step 608), the m groups of symbols is sequenced into R×m symbols to form an n-symbol input codeword block at step 609. In this input codeword block the unknown symbols occur sequentially at a location corresponding the lost or corrupted network packets.

At step 612, an (n,k) symbol decoder is applied to the input codeword block from either of steps 609 or 610. The result is recovery of the unknown symbol variables, and at step 614, the original k-symbol data block is constructed and the original message packet recovered. At step 616, the recovered message packet is delivered to an upper layer protocol stack component, such as a communication application.

Finally, at step 618, a determination is made as to whether there are more network packets waiting to be decoded. If there are ("Yes" branch from step 618), the process returns to step 602 and repeats. If there is not another message packet waiting ("No" branch from step 618), the process ends at step 620.

It will be appreciated that the logical steps represented in FIGS. 5 and 6 are illustrative, and that other steps and/or arrangements of steps could be used to implement packet encoding and decoding in accordance with example embodiments of the present application.

FIG. 7 is a block diagram illustrating an example apparatus for carrying out symbol-level error correction encoding and decoding in accordance with an example embodiment of the present application. In a very basic configuration 701, computing device 700 typically includes one or more processors 710 and system memory 720. A memory bus 730 can be used for communicating between the processor 710 and the system memory 720.

Depending on the desired configuration, processor 710 can be of any type including but not limited to a microprocessor (μP), a microcontroller (μC), a digital signal processor (DSP), or any combination thereof. Processor 710 can include one more levels of caching, such as a level one cache 711 and a level two cache 712, a processor core 713, and registers 714. The processor core 713 can include an arithmetic logic unit (ALU), a floating point unit (FPU), a digital signal processing core (DSP Core), or any combination thereof. A memory controller 715 can also be used with the processor 710, or in some implementations the memory controller 715 can be an internal part of the processor 710.

Depending on the desired configuration, the system memory 720 can be of any type including but not limited to volatile memory (such as RAM), non-volatile memory (such as ROM, flash memory, etc.) or any combination thereof. System memory 720 typically includes an operating system 721, one or more applications 722, and program data 724. Application 722 includes a symbol-level error correction encoding and decoding algorithm 723 that is arranged to carry out the various function and steps of error-control encoding and decoding described here. For example, the symbol-level error correction encoding and decoding algorithm 723 could include executable instructions described in the discussion of FIGS. 5 and 6. Program Data 724 includes symbol-level error correction encoding and decoding data 725 such as symbols, codeword blocks, and packet payloads, among other data elements of the embodied methods. In some example embodiments, application 722 can be arranged to operate with program data 724 on an operating system 721 to accomplish the encoding and decoding described herein. This described basic configuration is illustrated in FIG. 7 by those components within dashed line 701.

Computing device 700 can have additional features or functionality, and additional interfaces to facilitate communications between the basic configuration 701 and any required devices and interfaces. For example, a bus/interface controller 740 can be used to facilitate communications between the basic configuration 701 and one or more data storage devices 750 via a storage interface bus 741. The data storage devices 750 can be removable storage devices 751, non-removable storage devices 752, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 720, removable storage 751 and non-removable storage 752 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer storage media can be part of device 700.

Computing device 700 can also include an interface bus 742 for facilitating communication from various interface devices (e.g., output interfaces, peripheral interfaces, and communication interfaces) to the basic configuration 701 via the bus/interface controller 740. Example output interfaces 760 include a graphics processing unit 761 and an audio processing unit 762, which can be configured to communicate to various external devices such as a display or speakers via one or more A/V ports 763. Example peripheral interfaces 760 include a serial interface controller 771 or a parallel interface controller 772, which can be configured to communicate with external devices such as input devices (e.g., keyboard, mouse, pen, voice input device, touch input device, etc.) or other peripheral devices (e.g., printer, scanner, etc.) via one or more I/O ports 773. An example communication interface 780 includes a network controller 781, which can be arranged to facilitate communications with one or more other computing devices 790 over a network communication via one or more communication ports 782. The Communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 700 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 can also be implemented as a personal computer including both laptop computer and non-laptop computer configurations.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. In a packet encoding device, a method of encoding packets comprising:
   receiving a message packet;
   subdividing the received message packet into a sequence of k symbols, each of the k symbols comprising p>1 bits and each being a symbol in a symbol alphabet defined over GF(q), wherein q is a positive integer;
   encoding the k symbols into a computed codeword block of n symbols $c_i$, i=[0, . . . , n−1], wherein n>k,
   wherein the n symbols of the computed codeword block satisfy a family of equations calculated over GF(q) and having parameters q, α and β,
   wherein each symbol $c_1$ is a symbol in the symbol alphabet defined over GF(q),
   and wherein α and β are both positive integers, and a specifies a number x≦α of the n symbols that are recoverable by an inverse decoding procedure applied to a modified codeword block that corresponds to the computed codeword block with x of the symbols having undetermined values;
   packetizing the computed codeword block of n symbols into a sequence of m>1 network packets, each network packet in the sequence including an indicator of its position in the sequence; and
   transmitting the sequence of network packets on a network communicatively coupled with the packet encoding device.

2. The method of claim 1, wherein p is at least a number of bits per symbol needed to define q unique symbols of the symbol alphabet over GF(q).

3. The method of claim 1, wherein encoding the k symbols into the computed codeword block of n symbols comprises determining a value of n sufficiently large to make α of the n symbols recoverable by the inverse decoding procedure applied to the modified codeword block with x=α.

4. The method of claim 1, wherein the family of equations is given by $$\sum_{i=0}^{n-1}((q-\beta)-i)^\alpha c_i = 0 \text{ calculated over } GF(q)$$

and corresponds to α equations $$\sum_{i=0}^{n-1}((q-\beta)-i)^\alpha c_i = 0$$

$$\sum_{i=0}^{n-1}((q-\beta)-i)^{\alpha-1} c_i = 0$$

$$\vdots$$

-continued $$\sum_{i=0}^{n-1}((q-\beta)-i)c_i = 0,$$

each calculated modulo q,
and wherein encoding the k symbols into the computed codeword block of n symbols comprises determining all of the n symbols so that the family of equations is satisfied.

5. The method of claim 1,
wherein encoding the k symbols into the computed codeword block of n symbols comprises arranging the n symbols in a defined sequence within the computed codeword block so that each of the n symbols occupies a known position in the computed codeword block,
and wherein each of the x symbols with an undetermined value occupies a known position in the modified codeword block.

6. The method of claim 1, wherein packetizing the computed codeword block of n symbols into the sequence of m>1 network packets comprises interleaving the n symbols across the sequence of m>1 network packets.

7. The method of claim 1, wherein transmitting the sequence of network packets on the network comprises transmitting the sequence of network packets to a packet decoding device that is operable to perform the decoding procedure and is communicatively connected with the packet encoding device by way of the network.

8. A packet encoding device comprising:
means for receiving a message packet;
means for subdividing the received message packet into a sequence of k symbols, wherein each of the k symbols comprises p>1 bits and each is a symbol in a symbol alphabet defined over GF(q), wherein q is a positive integer;
means for encoding the k symbols into a computed codeword block of n symbols $c_i$, i=[0, . . . , n−1], wherein n>k,
wherein the n symbols of the computed codeword block satisfy a family of equations calculated over GF(q) and having parameters q, α and β,
wherein each symbol $c_i$ is a symbol in the symbol alphabet defined over GF(q), and
wherein α and β are both positive integers, and α specifies a number x≦α of the n symbols that are recoverable by an inverse decoding procedure applied to a modified codeword block that corresponds to the computed codeword block with x of the symbols having undetermined values;
means for packetizing the computed codeword block of n symbols into a sequence of m>1 network packets, wherein each network packet in the sequence includes an indicator of its position in the sequence; and
means for transmitting the sequence of network packets on a network with which the packet encoding device is configured to be communicatively coupled.

9. The packet encoding device of claim 8, wherein p is at least a number of bits per symbol needed to define q unique symbols of the symbol alphabet over GF(q).

10. The packet encoding device of claim 8, wherein encoding the k symbols into the computed codeword block of n symbols comprises determining a value of n sufficiently large to make α of the n symbols recoverable by the inverse decoding procedure applied to the modified codeword block with x=α.

11. The packet encoding device of claim 8, wherein the family of equations is given by $$\sum_{i=0}^{n-1}((q-\beta)-i)^{\alpha}c_i = 0 \text{ calculated over } GF(q)$$

and corresponds to α equations $$\sum_{i=0}^{n-1}((q-\beta)-i)^{\alpha}c_i = 0$$

$$\sum_{i=0}^{n-1}((q-\beta)-i)^{\alpha-1}c_i = 0$$

$$\vdots$$

$$\sum_{i=0}^{n-1}((q-\beta)-i)c_i = 0,$$

each calculated modulo q,
and wherein encoding the k symbols into the computed codeword block of n symbols comprises determining all of the n symbols so that the family of equations is satisfied.

12. The packet encoding device of claim 8, wherein encoding the k symbols into the computed codeword block of n symbols comprises arranging the n symbols in a defined sequence within the computed codeword block so that each of the n symbols occupies a known position in the computed codeword block, and
wherein each of the x symbols with an undetermined value occupies a known position in the modified codeword block.

13. The packet encoding device of claim 8, wherein packetizing the computed codeword block of n symbols into the sequence of m>1 network packets comprises interleaving the n symbols across the sequence of m>1 network packets.

14. The packet encoding device of claim 8, wherein transmitting the sequence of network packets on the network comprises transmitting the sequence of network packets to a decoding device that is operable to perform the decoding procedure and to which the packet encoding device is configured to be communicatively connected by way of the network.

15. A non-transitory computer-readable medium having instructions stored thereon that, upon execution by a packet encoding device, cause the packet encoding device to carry out functions comprising:
receiving a message packet;
subdividing the received message packet into a sequence of k symbols, wherein each of the k symbols comprises p>1 bits and each is a symbol in a symbol alphabet defined over GF(q), wherein q is a positive integer;
encoding the k symbols into a computed codeword block of n symbols $c_i$, i=[0, . . . , n−1], wherein n>k,
wherein the n symbols of the computed codeword block satisfy a family of equations calculated over GF(q) and having parameters q, α and β,
wherein each symbol $c_i$ is a symbol in the symbol alphabet defined over GF(q), and
wherein α and β are both positive integers, and α specifies a number x≦α of the n symbols that are recoverable by an inverse decoding procedure applied to a modified codeword block that corresponds to the computed codeword block with x of the symbols having undetermined values;

packetizing the computed codeword block of n symbols into a sequence of m>1 network packets, wherein each network packet in the sequence includes an indicator of its position in the sequence; and transmitting the sequence of network packets on a network to which the encoding device is configured to be communicatively coupled.

16. The non-transitory computer-readable medium of claim 15, wherein p is at least a number of bits per symbol needed to define q unique symbols of the symbol alphabet over GF(q).

17. The non-transitory computer-readable medium of claim 15, wherein encoding the k symbols into the computed codeword block of n symbols comprises determining a value of n sufficiently large to make α of the n symbols recoverable by the inverse decoding procedure applied to the modified codeword block with x=α.

18. The non-transitory computer-readable medium of claim 15, wherein the family of equations is given by $$\sum_{i=0}^{n-1}((q-\beta)-i)^\alpha c_i = 0 \text{ calculated over } GF(q)$$

and corresponds to α equations $$\sum_{i=0}^{n-1}((q-\beta)-i)^\alpha c_i = 0$$

$$\sum_{i=0}^{n-1}((q-\beta)-i)^{\alpha-1} c_i = 0$$

$$\vdots$$

$$\sum_{i=0}^{n-1}((q-\beta)-i)c_i = 0,$$

each calculated modulo q, and wherein encoding the k symbols into the computed codeword block of n symbols comprises determining all of the n symbols so that the family of equations is satisfied.

19. The non-transitory computer-readable medium of claim 15, wherein encoding the k symbols into the computed codeword block of n symbols comprises arranging the n symbols in a defined sequence within the computed codeword block so that each of the n symbols occupies a known position in the computed codeword block, and wherein each of the x symbols with an undetermined value occupies a known position in the modified codeword block.

20. The non-transitory computer-readable medium of claim 15, wherein packetizing the computed codeword block of n symbols into the sequence of m>1 network packets comprises interleaving the n symbols across the sequence of m>1 network packets.

21. A method comprising:

encoding k symbols into a computed codeword block of n symbols $c_i$, i=[0, . . . , n−1], wherein n>k, each of the k symbols being a symbol in a symbol alphabet defined over GF(q), wherein q is a positive integer, wherein the n symbols of the computed codeword block satisfy a family of equations calculated over GF(q) and having parameters q and α, wherein each symbol $c_i$ is a symbol in the symbol alphabet defined over GF(q), and wherein α is a positive integer and specifies a number x≦α of the n symbols that are recoverable by an inverse decoding procedure applied to a modified codeword block that corresponds to the computed codeword block with x of the symbols having undetermined values; and packetizing the computed codeword block of n symbols into a sequence of network packets, each network packet in the sequence including an indicator of its position in the sequence.

22. The method of claim 21, wherein encoding the k symbols into the computed codeword block of n symbols comprises determining a value of n sufficiently large to make a of the n symbols recoverable by the inverse decoding procedure applied to the modified codeword block with x=α.

23. The method of claim 21, wherein the family of equations is given by $$\sum_{i=0}^{n-1}((q-\beta)-i)^\alpha c_i = 0 \text{ calculated over } GF(q)$$

and corresponds to α equations $$\sum_{i=0}^{n-1}((q-\beta)-i)^\alpha c_i = 0$$

$$\sum_{i=0}^{n-1}((q-\beta)-i)^{\alpha-1} c_i = 0$$

$$\vdots$$

$$\sum_{i=0}^{n-1}((q-\beta)-i)c_i = 0,$$

each calculated modulo q, wherein β is a positive integer, and wherein encoding the k symbols into the computed codeword block of n symbols comprises determining all of the n symbols so that the family of equations is satisfied.

24. The method of claim 21, wherein encoding the k symbols into the computed codeword block of n symbols comprises arranging the n symbols in a defined sequence within the computed codeword block so that each of the n symbols occupies a known position in the computed codeword block, and wherein each of the x symbols with an undetermined value occupies a known position in the modified codeword block.

25. The method of claim 21, wherein packetizing the computed codeword block comprises:

packetizing the computed codeword block into a sequence of m>1 network packets, and interleaving the n symbols across the sequence of m>1 network packets.

26. A packet encoding device programmed to execute instructions to carry out functions comprising:

encoding k symbols into a computed codeword block of n symbols $c_i$, i=[0, ..., n−1], wherein n>k, each of the k symbols being a symbol in a symbol alphabet defined over GF(q), wherein q is a positive integer,
- wherein the n symbols of the computed codeword block satisfy a family of equations calculated over GF(q) and having parameters q and α,
- wherein each symbol $c_i$ is a symbol in the symbol alphabet defined over GF(q), and
- wherein α is a positive integer and specifies a number x≦α of the n symbols that are recoverable by an inverse decoding procedure applied to a modified codeword block that corresponds to the computed codeword block with x of the symbols having undetermined values;

packetizing the computed codeword block of n symbols into a sequence of network packets, each network packet in the sequence including an indicator of its position in the sequence; and outputting the sequence of network packets.

27. The packet encoding device of claim 26, wherein encoding the k symbols into the computed codeword block of n symbols comprises determining a value of n sufficiently large to make a α the n symbols recoverable by the inverse decoding procedure applied to the modified codeword block with x=α.

28. The packet encoding device of claim 26, wherein the family of equations is given by $$\sum_{i=0}^{n-1} ((q-\beta)-i)^\alpha c_i = 0 \text{ calculated over } GF(q)$$

and corresponds to a equations $$\sum_{i=0}^{n-1} ((q-\beta)-i)^\alpha c_i = 0$$

$$\sum_{i=0}^{n-1} ((q-\beta)-i)^{\alpha-1} c_i = 0$$

$$\vdots$$

$$\sum_{i=0}^{n-1} ((q-\beta)-i) c_i = 0,$$

each calculated modulo q, and wherein encoding the k symbols into the computed codeword block of n symbols comprises determining all of the n symbols so that the family of equations is satisfied.

29. The packet encoding device of claim 26,
wherein encoding the k symbols into the computed codeword block of n symbols comprises arranging the n symbols in a defined sequence within the computed codeword block so that each of the n symbols occupies a known position in the computed codeword block,
and wherein each of the x symbols with an undetermined value occupies a known position in the modified codeword block.

30. The packet encoding device of claim 26, wherein packetizing the computed codeword block of n symbols into the sequence of m>1 network packets comprises interleaving the n symbols across the sequence of m>1 network packets.

31. A non-transitory computer-readable medium having instructions stored thereon that, upon execution by a computing device, cause the computing device to perform functions comprising:

encoding k symbols into a computed codeword block of n symbols $c_i$, i=[0, ..., n−1], wherein n>k, each of the k symbols being a symbol in a symbol alphabet defined over GF(q), wherein q is a positive integer,
- wherein the n symbols of the computed codeword block satisfy a family of equations calculated over GF(q) and having parameters q and α,
- wherein each symbol $c_i$ is a symbol in the symbol alphabet defined over GF(q), and
- wherein α is a positive integer and specifies a number x≦α of the n symbols that are recoverable by an inverse decoding procedure applied to a modified codeword block that corresponds to the computed codeword block with x of the symbols having undetermined values; and packetizing the computed codeword block of n symbols into a sequence of network packets, each network packet in the sequence including an indicator of its position in the sequence.

32. The non-transitory computer-readable medium of claim 31, wherein encoding the k symbols into the computed codeword block of n symbols comprises determining a value of n sufficiently large to make α of the n symbols recoverable by the inverse decoding procedure applied to the modified codeword block with x=α.

33. The non-transitory computer-readable medium of claim 31, wherein the family of equations is given by $$\sum_{i=0}^{n-1} ((q-\beta)-i)^\alpha c_i = 0 \text{ calculated over } GF(q)$$

and corresponds to α equations $$\sum_{i=0}^{n-1} ((q-\beta)-i)^\alpha c_i = 0$$

$$\sum_{i=0}^{n-1} ((q-\beta)-i)^{\alpha-1} c_i = 0$$

$$\vdots$$

$$\sum_{i=0}^{n-1} ((q-\beta)-i) c_i = 0,$$

each calculated modulo q, and wherein encoding the k symbols into the computed codeword block of n symbols comprises determining all of the n symbols so that the family of equations is satisfied.

34. The non-transitory computer-readable medium of claim 31,
wherein encoding the k symbols into the computed codeword block of n symbols comprises arranging the n symbols in a defined sequence within the computed codeword block so that each of the n symbols occupies a known position in the computed codeword block, and
wherein each of the x symbols with an undetermined value occupies a known position in the modified codeword block.

35. The non-transitory computer-readable medium of claim 31, wherein packetizing the computed codeword block of n symbols into the sequence of m>1 network packets comprises interleaving the n symbols across the sequence of m>1 network packets.

* * * * *

UNITED STATES PATENT AND TRADEMARK OFFICE
CERTIFICATE OF CORRECTION

| | | |
|---|---|---|
| PATENT NO. | : 8,479,082 B2 | Page 1 of 1 |
| APPLICATION NO. | : 12/824880 | |
| DATED | : July 2, 2013 | |
| INVENTOR(S) | : Bose | |

It is certified that error appears in the above-identified patent and that said Letters Patent is hereby corrected as shown below:

In the Specification

In Column 5, Line 33, delete "a specifies" and insert -- α specifies --, therefor.

In Column 8, Line 51, delete "a separate" and insert -- α separate --, therefor.

In the Claims

In Column 16, Line 29, in Claim 1, delete "and a" and insert -- and α --, therefor.

In Column 17, Line 46, in Claim 8, delete "and a" and insert -- and α --, therefor.

In Column 18, Line 65, in Claim 15, delete "and a" and insert -- and α --, therefor.

In Column 19, Line 30, in Claim 18, delete "to a" and insert -- to α --, therefor.

In Column 20, Line 21, in Claim 22, delete "make a" and insert -- make α --, therefor.

In Column 21, Line 25, in Claim 27, delete "make a α" and insert -- make α --, therefor.

In Column 21, Line 36, in Claim 28, delete "to a" and insert -- to α --, therefor.

Signed and Sealed this
Twenty-ninth Day of April, 2014

Michelle K. Lee
*Deputy Director of the United States Patent and Trademark Office*